(12) United States Patent
Amir et al.

(10) Patent No.: US 6,747,215 B2
(45) Date of Patent: Jun. 8, 2004

(54) FAT CONDUCTOR

(76) Inventors: Jack Amir, c/o Magink Display Technologies, P.O. Box 3670, Mevaseret Zion (IL), 90805; Amir Ben-Shalom, c/o Magink Display Technologies, P.O. Box 3670, Mevaseret Zion (IL), 90805

( * ) Notice: Subject to any disclaimer, the term of this patent is extended or adjusted under 35 U.S.C. 154(b) by 0 days.

(21) Appl. No.: 10/250,338

(22) PCT Filed: Dec. 27, 2001

(86) PCT No.: PCT/IL01/01211
§ 371 (c)(1),
(2), (4) Date: Jun. 28, 2003

(87) PCT Pub. No.: WO02/054414
PCT Pub. Date: Jul. 11, 2002

(65) Prior Publication Data
US 2004/0055785 A1 Mar. 25, 2004

(30) Foreign Application Priority Data
Dec. 29, 2000 (IL) .................................................. 140645
Nov. 1, 2001 (IL) .................................................. 146294

(51) Int. Cl.[7] ................................................ H05K 1/00
(52) U.S. Cl. ...................... 174/256; 174/259; 442/348
(58) Field of Search ................................. 174/256, 257, 174/259, 260; 442/348, 180, 341; 349/149, 150

(56) References Cited

U.S. PATENT DOCUMENTS

| | | | | | |
|---|---|---|---|---|---|
| 5,179,460 A | * | 1/1993 | Hinata et al. | ................ | 349/149 |
| 5,237,130 A | * | 8/1993 | Kulesza et al. | ............. | 174/260 |
| 6,245,696 B1 | * | 6/2001 | Haas et al. | ................. | 442/348 |

* cited by examiner

*Primary Examiner*—Chau Nguyen N.
(74) *Attorney, Agent, or Firm*—John A. Galbreath (57) ABSTRACT

A fat conductor electrically interconnecting between a pair of substantially parallel plates wherein each of the plates has a prearranged pattern of conducting surface coating regions on the central interior face side thereof, and the fat conductor is specifically for use in sandwiched constructions of the plates having encapsulated dielectric film there-between, the fat conductor including: two thin conductive surface coating pads of substantially complementary size and one of the two pads is located on each facing plate and the pads are situated to face each other when the plates are sandwiched together and each pad has an associated conductive surface coating path on its respective surface; a perimeter wall of adhesive arranged around one of the pads; and a conductive paste situated within the perimeter wall such that when the plates are sandwiched together there is formed an electrically conductive connection between the pads via the paste.

16 Claims, 7 Drawing Sheets

FAT CONDUCTOR

A portion of the disclosure of this patent document contains material which is subject to copyright protection or to mask-work protection. The copyright owner has no objection to the facsimile reproduction by anyone of the patent document or the patent disclosure, as it appears in the Patent and Trademark Office patent file or records, but otherwise reserves all copyright rights whatsoever.

A mask work is a kind of map or blueprint used to design and manufacture a semiconductor chip or circuits that are fabricated on like materials. The mask work defines the design of the chip in three dimensions, since a semiconductor chip consists of several layers of electronic circuits and elements that are laid down one atop another. The mask work images may be in pictorial or photographic form or broken down into digital numerical form for storage in a computer. Furthermore, the mask-work owner reserves all rights to the integrated circuit topography of mask-work examples presented hereinafter.

FIELD OF THE INVENTION

The present invention generally relates to an electrically conductive attachment. More specifically, the present invention relates to use of a thickened electrical conductor material for connection between two conductive segments located on facing surfaces.

BACKGROUND OF THE INVENTION

Numerous components are currently fabricated which methodologically require coordination between a conductive region (or segment) on a first surface and another conductive region (or segment) on a facing surface. This type of construction is typical in the fabrication of liquid crystal display (hereinafter "LCD") panels. The LCD panels consist of two plates with an encapsulated liquid crystal film layer there between. The encapsulation is to prevent the incursion of moisture, air, or environmental contaminants. Furthermore, the plates (generally of glass, silicon, or plastic) include at least one rigid plate and at least one transparent (or substantially non-opaque) plate. Most well-know applications use two rigid plates. In order for a region of the liquid crystal material to obtain a predetermined optical property, an electric field is established above a threshold value and thereafter quickly discontinued. In order for this predetermined optical property to be cancelled, an electric field is established—generally above a lower threshold value and then gradually discontinued.

In order to apply either electric field to a selected region of the LCD (especially cholesteric liquid crystal), there are pre-positioned conductors on opposite interior faces of the plates. Furthermore, in order to electrically access these conductors, there is a conductive path from an exterior contact point to each respective conductor. By this means, selecting from pairs of exterior contacts will allow a controller to address the optical property of a selected pixel region—in the case where conductors on one face are parallel x-axis lines and conductors on the opposite face are parallel y-axis lines. Alternatively, there are icon oriented displays (rather than general purpose pixel type displays) where specific conductive patterns are established on regions of opposite faces and conductive lines are arranged respectively thereto from the plate edges in order to facilitate addressing of the icons; or more specifically their respective optical property setting.

Generally, the conductors are selected in LCDs to be transparent conductors (such as indium-tin-oxide) but very narrow visible conductive lines also are used in particular applications. These conductors are applied to the surface of the plate(s) during a fabrication process by using deposition and etching techniques for high-resolution arrangements, and with silk-screening type techniques for lower resolution applications.

There is a longstanding, well accepted axiom in the procedure for designing and fabricating LCD plate pair units, and the likes, that one needs conductive contact points on at least one exterior edge of each plate in order to address opposing pairings of conductors on opposite faces. This long accepted need results in plate pairs having at least two edge regions that do not participate in the display area per se, but only exist to provide the functionality of connective access to specific regions of the interior faces. Because there are two edge regions, there is a need in the packaging of these plate pair products for two sets of attachments; one for each edge region. Simply stated, there is a need in the art for a reduction in the number of such attachments; particularly since each independently contributes to the fabrication cost per unit. Nevertheless, it would be a significant advance in the art for the at least two edge regions to be unifies into a lesser number of contiguous regions; and presumably optimally into one contiguous region.

One might expect that electrical interconnections between facing surfaces to be a standard method for overcoming this apparent topological over engineering, but no such fabrications technique has been forthcoming.

One might consider p-type or n-type materials that are selectively deposited (using optical-mask transfer techniques) on semiconductor substrates functionally as examples of inter-layer electrical connectivity. However, layering of these types of materials is explicitly for implementing active electrical elements, such as memory, gates, logic circuits, counters, etc.; or on a more refined level of analysis, for partial capacitance, partial resistance, etc. and not for simple electrical connectivity across facing surfaces. Actually, the deposition and etching techniques implements in mask work products incorporating p-type or n-type materials are specifically characterized by building up circuit functionally onto a single surface; and not building up two circuit halves for eventual aligned interface and electrically circuit interconnectivity. Fabricating three-dimensional circuits in this way would suffer from certain lower precision available in mechanical alignment between the plate surface faces than in the deposition and etching. Hence, one would never consider a hybrid process of building up semiconductor layers simultaneously with even a single mechanically aligned pairing between two of those layers.

Alternatively, one might consider solder points on printed circuit boards (hereinafter "PCB") as perhaps contributing to some reduced topological complexity for multiple PCB layers. However these configurations are integrated by design with a plurality of pre-drilled component attachment holes; and are not present for actually implementing simple electrical contact between otherwise facing PCB layer surfaces—nor can one easily find a reason for what such a sandwich construction would be trying to accomplish.

Collectively, it appears that in the world of layered electrical components having interstitial dielectric thin film interfacing (such as LCDs) there has been no novel implementations of simple electrical topological simplifications using inter layer electrical connections. While U.S. Pat. No. 5,283,948 U.S. Pat. No. 6,063,647 and U.S. Pat. No. 6,239,384 each describe a form of perpendicular connector that might be useful for implementing basic topological simplifications in such systems, no evidence of such application has been forthcoming. Thus, it is surprising that in the super competitive high tech CAD/CAM type electronic component fabrication environment of LCDs there has been no progressive solution for reducing the electrical connective architecture; which is one of the most expensive per unit aspects of these components; after the overall fabrication setup costs have been amortized.

BRIEF SUMMARY OF THE INVENTION

The present invention relates to a fat conductor. The fat conductor of the present invention is especially useful for electrically interconnecting between a pair of substantially parallel plates, wherein each of the plates has a prearranged pattern of conducting surface coating regions on the interior face side thereof. The fat conductor is specifically for use in sandwiched constructions of the plates having encapsulated dielectric film there-between. In fact, the major accomplishment of the fat conductors of the present invention resides in the facility to places these fat conductors substantially anywhere on the plate; and not just in the unseen exterior peripheral frame region of the plate.

Embodiments of the fat conductor of the present invention include three interrelated elements: conductive surface coating pads (matching), a perimeter wall (around one of the pads), and a conductive paste (for electrically connecting between the pads within the region restricted within the perimeter wall). Furthermore, for simplicity of understanding, the most useful aspect of the present invention lies in the ability to locate viable fat conductors substantially anywhere that a conductive pad can be fabricated, especially in central areas of substrate plates; and not restricted to placement in the unseen exterior peripheral frame region of the plate which are often hidden from view by plate holders. In contradistinction, the exterior peripheral frame region of the plate is generally characterized as not being circumscribed by a dielectric material layer on all sides, by reason of environmental encapsulation functions that are generally engineered in the region of the plate edges.

Note that sometimes in the literature "conductive pastes" are called "conductive creams" especially in cases where they are applied using silk screening techniques rather than sputtering or deposition techniques. Elsewhere in the literature, these viscous conductive "pastes" are called "thick non-volatile conductive inks". Generally, conductive pastes rely on a high quantity of fine suspended conductive particles (e.g. powered silver, gold, palladium, etc.) to achieve the basic conductive properties. However, sometimes the conductive properties are achieved using conductive carrier materials in the paste, such as conductive polymers or conductive metallo-organics, etc. Specific election of a practical cost effective conductive paste is generally in consideration of electro-chemical interactions with contiguous or proximate materials, available environmental encapsulations, galvanic isolation, etc., and in consideration of other environmental use factors (e.g. operating temperature, cross talk effects, etc.).

One should appreciate from the outset that, while there may be many useful applications of a solitary fat conductor between a pair of plates, it is a fundamental objective of the present invention to address improvements in the fabrication of liquid crystal displays; and related flat panel type constructions wherein a large number of fat conductors are used in a single construction. For example, in the case of LCDs, the construction would substantially require about the number of rows or the numbers of columns (which ever is the lesser number) in at least one layer of the display. Fabrications of components having only a single instantiation of a fat conductor therein are beyond the scope of the present invention. The present invention is directed to components having a plurality of fat conductors therein, and typically to those having a large number of fat conductors therein. Furthermore, one should be aware that the dielectric film located between the plates will generally require at least some global encapsulation against the intrusion of moisture, air, and other environmental contaminants. The mechanics of such encapsulation, for a region between plates or for a pair of plates or for "sandwiches" including more than two plates, is beyond the scope of the present application; and is generally well understood by those whose art includes the filling and sealing of dielectric film between plates—such as in the case of LCDs.

Generally, that is to say for convenience of understanding, one can portray the fat conductor of the present invention as being an electrically conductive paste that is laterally constrained within a perimeter wall and operable along a normal axis between the two pads. Simply stated, the conductive paste when properly situated between the pads is a "fat conductor," and when properly constrained within the perimeter wall, continues to perform as a conductor; since otherwise the conductive paste will either disperse until the critical amount required to maintain electrical contact is depleted, or until sufficient peripheral impurities permeate the conductor and thereby "spoil" the desired electrical conductive property—for example by introducing amorphous capacitance regions, etc.

According to the above-mentioned embodiments of the fat conductor of the present invention, the pads are two thin conductive surface coating pads that are of substantially complementary size. One of the two pads is located on each facing plate. The pads are situated to face each other when the plates are sandwiched together. Each pad has an associated conductive surface coating path on its respective surface. For many applications, it has been found that pad shapes with large perimeter to area rations are preferred. The simplest of such pad designs is a pad with a concentric central void. For example a circular pad with a circular central void area or a rectangular pad with a rectangular void area. In principal, for larger pads it is expected that the central area be a tessellation (regular, irregular or recursive) of interconnected mini-pads. It appears that the functionality of the electrical connection between the pad and the paste is generally improved according to these design criteria. Nevertheless, there are pastes that do not nee this extra level of pad design; and there are certainly pad designs that will accommodate pastes of otherwise poor interface qualities.

According to the above-mentioned embodiments of the fat conductor of the present invention, the perimeter wall is of adhesive that is arranged around one of the pads. This arrangement serves two purposes. Firstly, it contributes to the isolation of the conductive paste from the dielectric film. Secondly, it contributes to overall adhesion between the plates. Nevertheless, since adhesion between the plates can be achieved externally through correct choices in the packaging of the plates, the key property is related to marinating adequate separation between the paste and the film. Certainly, the operating conditions intended for the final apparatus of plates, fat conductors, etc., will substantially contribute to the precise specification of the adhesive; since temperature, vibration, radiation, and other exogenous factors affect the permeability of the adhesive and the miscibility of the film into the paste—and substantially not less importantly, of the paste into the film, and of the adhesive into either.

According to the above-mentioned embodiments of the fat conductor of the present invention, a conductive paste is situated within the perimeter wall such that when the plates are sandwiched together there is formed an electrically conductive connection between the pads via the paste. According to the simple embodiments of the present invention, the paste functions as a simple passive electrically conductive shunt between the pads, thereby closing a path in a circuit—having both pads as topological member thereof. According to more sophisticated embodiments of the present invention, the paste includes at least one active element therein; thereby effecting the functionality of a circuit—having both pads as topological member thereof.

BRIEF DESCRIPTION OF THE DRAWINGS

A more complete understanding of the present invention and the advantages thereof may be acquired by referring to the following description in consideration of the accompanying drawings, in which like reference numbers indicate like features and wherein.

DETAILED DESCRIPTION OF THE INVENTION

Figure 1:
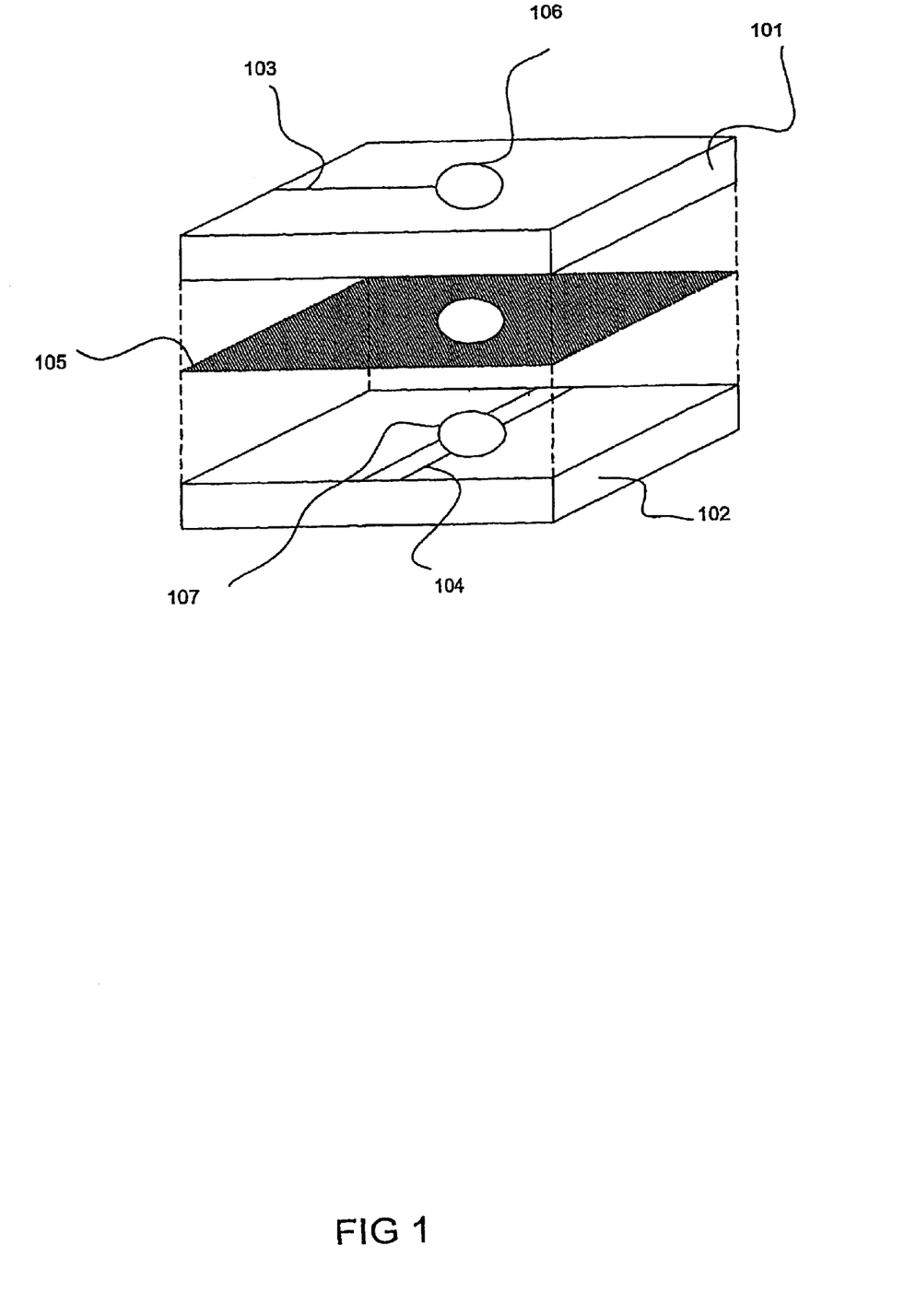
FIG. 1 shows a schematic diagram of a general implementation of a fat conductor.

The present invention relates to a fat conductor. Turning to FIG. 1, the fat conductor of the present invention is especially useful for electrically interconnecting between a pair of substantially parallel plates 101 102 (also paired plates 201 and 202 in FIG. 2; and 601 and 702 in FIGS. 6–7), wherein each of the plates has a prearranged pattern of conducting surface coating regions 103 104 (also 303 and 304 in FIG. 3, 403 and 404 in FIG. 4, 603A–E and 704A–E in paired FIGS. 6 and 7)—generally thin layer conductive path portions—on the interior face side thereof. The fat conductor is specifically for use in sandwiched constructions of the plates having encapsulated dielectric film 105 therebetween.

Figure 2:
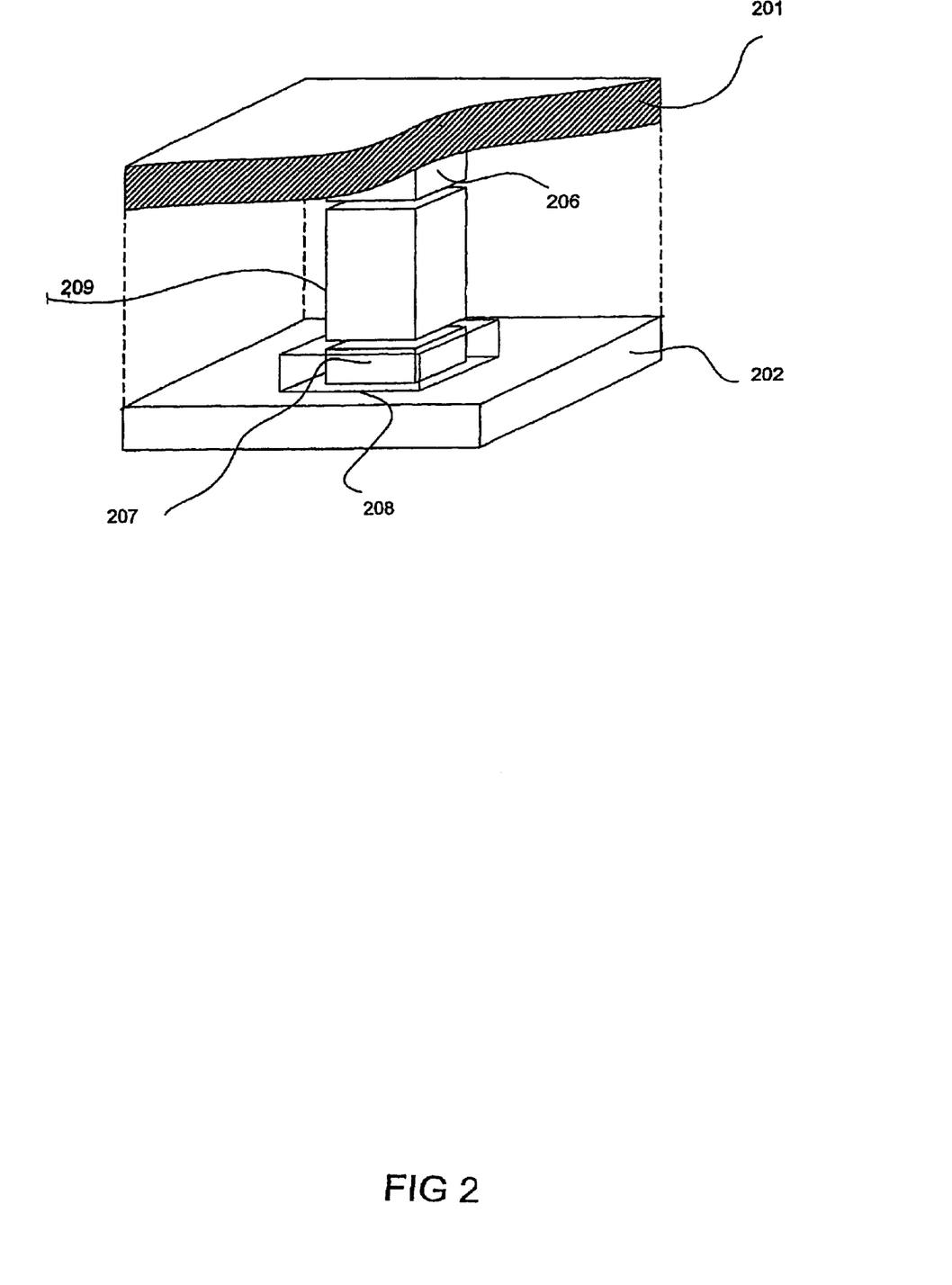
FIG. 2 shows a more detailed schematic cut-away diagram of a fat conductor.

Turning also to FIG. 2, embodiments of the fat conductor, according to the present invention include: two thin conductive surface coating pads of substantially complementary size and one of the two pads 106 107 in FIG. 1 (or 206 207 in FIG. 2; or 306 307 in FIG. 3; or 406 407 in FIG. 4; or 506 507 in FIG. 5; or 606A–E 707A–E in paired FIGS. 6–7) is located on each facing plate and the pads are situated to face each other when the plates are sandwiched together and each pad has an associated conductive surface coating path on its respective surface; a perimeter wall 208 (or 308, 408, respectively in FIGS. 3–4 and not shown in FIGS. 5–7) of adhesive arranged around one of the pads; and a conductive paste 209 (or 309, 409, 509 respectively in FIGS. 3–5, and not shown in FIGS. 6 or 7) situated within the perimeter wall such that when the plates are sandwiched together there is formed an electrically conductive connection between the pads via the paste.

Figure 3:
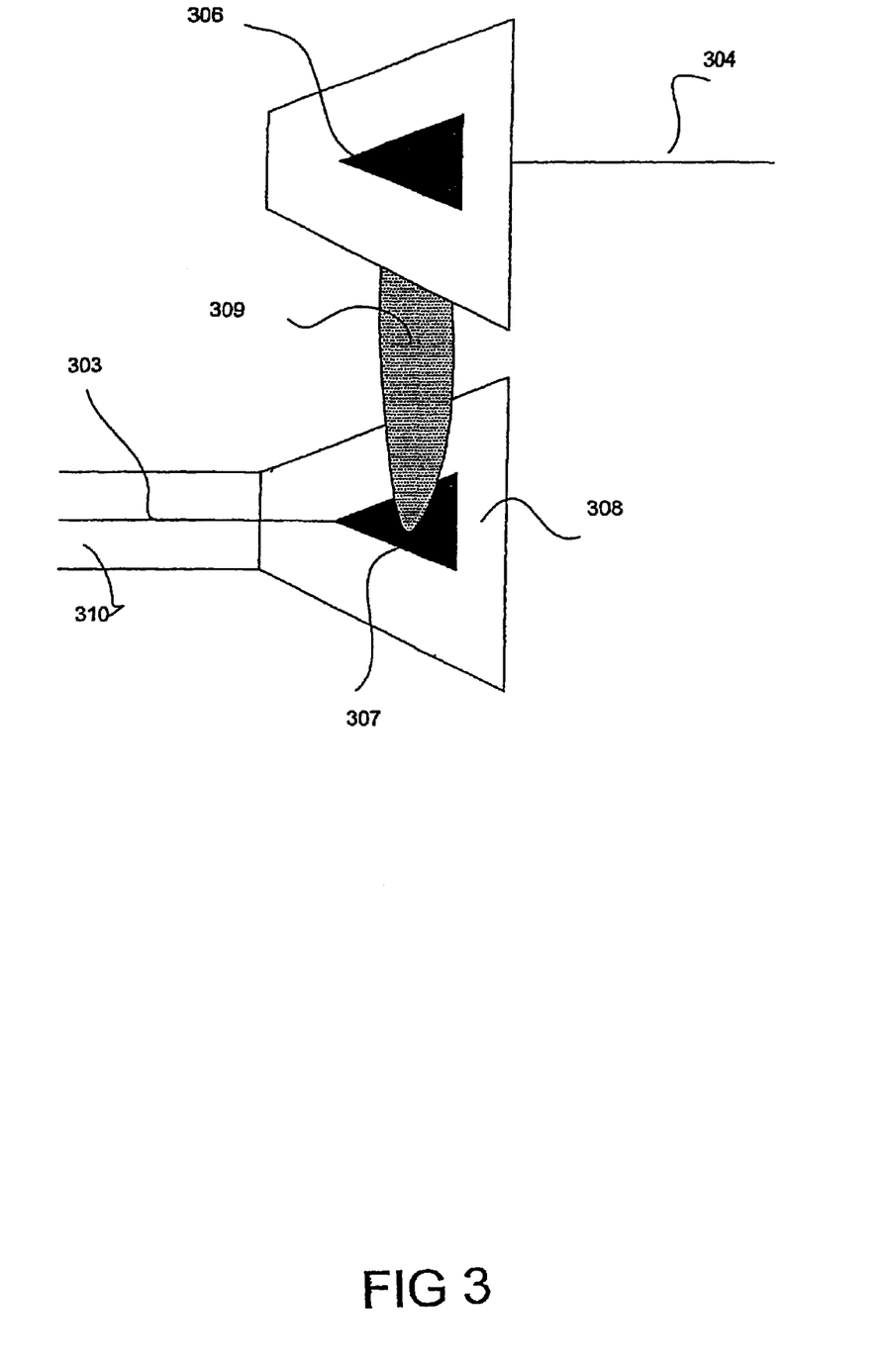
FIG. 3 shows a detailed schematic view of a useful variation fat conductor construction.
Figure 4:
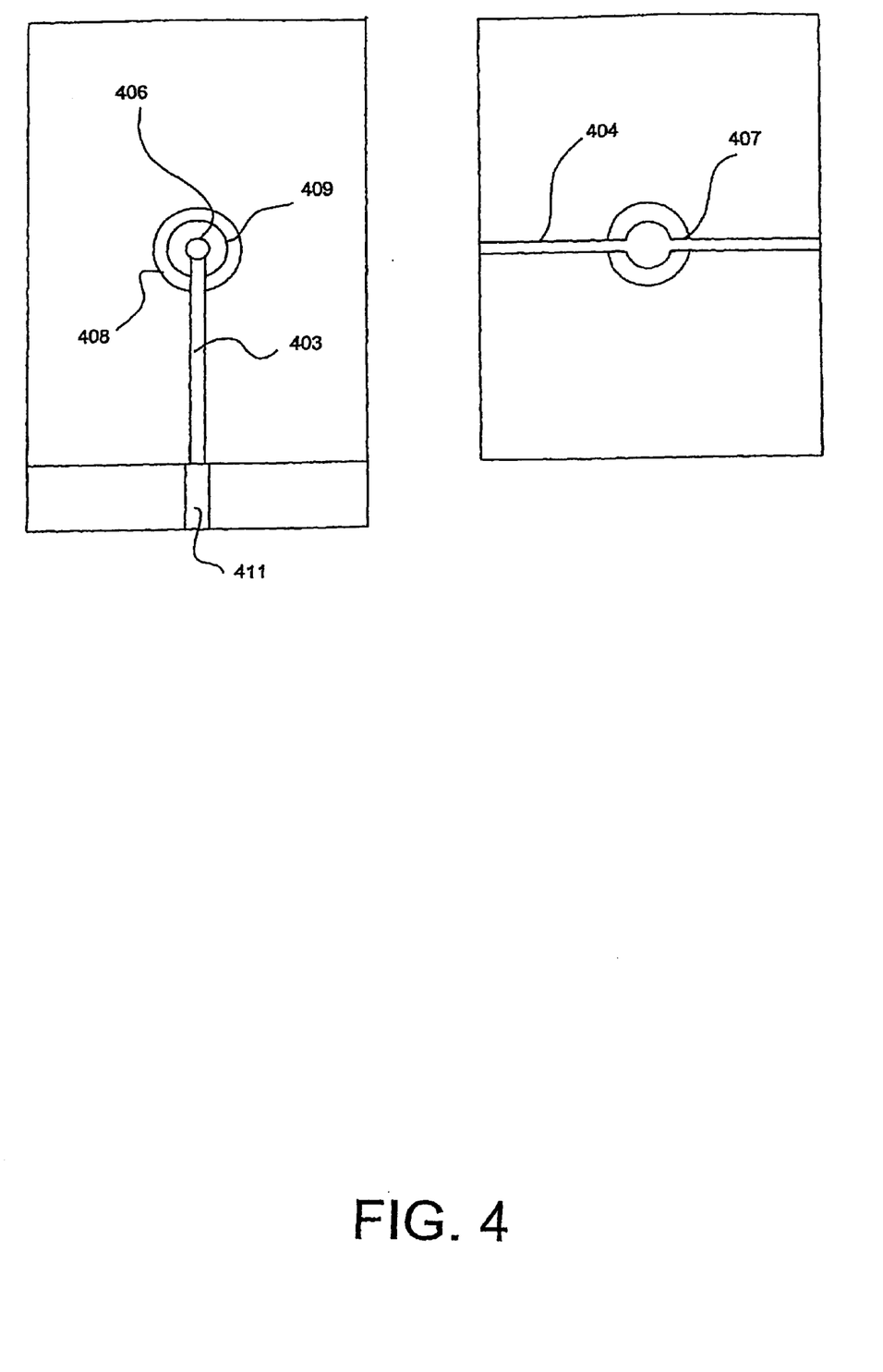
FIG. 4 shows another detailed schematic view of a fat conductor construction.

Turning to FIG. 3 in accordance with another embodiment of the present invention, the associated connective surface coating path includes a conductive layer proximate to the plate and an insulating layer 310 covering at least one predetermined area of the conductive layer. In instances where at least one of the plates is a glass plate, it is common practice for the conductive layer to be of Indium-Tin-Oxide (ITO) since this is a transparent conductor, which can be facilely deposited and etched. Nevertheless, many applications of the present invention are sufficiently embodied when non-transparent conductive paths are implemented, such as with Gold lines, Silver lines, etc. In the art of deposition and etching thereof it is well known that virtually and metallic material can be deposited and etched, and the specific choice material will generally depend on the nature of the plates, of the dielectric film, of the adhesive, and of the paste. According to the preferred embodiment of the present invention, the insulating layer is approximately 300–500 angstroms thick. Furthermore it is preferable that the pads are approximately 300–500 angstroms thick. Likewise it is preferable that the associated connective surface coating path is approximately 300–500 angstroms thick. Nevertheless, the actual choices of thickness for each respective portion will be determined according to the specific application, the associated circuitry, etc.

According to another specific embodiment of the present invention, the perimeter wall is approximately 4–7 microns thick. The most relevant aspects of the perimeter wall relate to its substantially inertness with respect to both the paste contained therein and the dielectric film located externally thereabout. Therefore, it is an important consideration in the choosing of a material for the wall that the material be workable in the environment conditions and time constraints of the fabrication process, and likewise according to the expected operating conditions for the resultant fabrication product.

According to a different embodiment of the present invention (as appreciated in conjunction with FIG. 4), the associated connective surface coating path of one of the pads extends to a connector region 411 (or 611 A–E in FIG. 6—note these are alternate lines in the group—in this specific embodiment) located proximate to an outer edge 412 (or 612 in FIG. 6) of the plate. This is the most well understood application of the fat conductor to date. In the preferred embodiment of the present invention, wherein a large plurality of fat conductors are implemented for paring two glass plates of an LCD matrix, use of conductive paths in conjunction with fat conductor "cross-overs" allows for a final product wherein all of the external connector attachments are located on one edge of a single plate. This converts into approximately halving the cost associated with electrical interconnection with the plate. Specifically, according to the preferred embodiment of the present invention, the connector region is arranged to be contiguously proximate to a preponderance of like connector regions and collectively all connector regions of the plate are located on a single edge of a single plate of the pair of plates.

According to still another embodiment of the present invention, the adhesive is an electrical insulator. This property restriction is only important in cases where electrical current leakage can cause spurious effects; such as circuit cross talk in embodiments where there are active circuit components in proximate other fat conductors, or in LCD application where unwanted electrical fields will degrade otherwise deterministic optical properties in the proximate Liquid Crystal (dielectric) film material.

According to yet another embodiment of the present invention, at least one of the plates is transparent and the adhesive is substantially optically transparent. This is particularly important in applications where the dielectric film is selected for its optical properties, optical memory, optical activity, etc. According to the preferred variation of this embodiment, the adhesive is substantially inert with respect to a dielectric material that is a liquid crystal. Furthermore, according to the preferred variation of this embodiment the liquid crystal is selected from the list: thermotropic; lyotropic; isotropic; nematic; twisted nematic; super twisted nematic; smectic; chiral nematic; cholesteric; cholesteric nematic; ferroelectric; surface-stabilized ferroelectric; ferroelectric chiral smectic; polymer dispersed; or the likes.

According to a further embodiment of the present invention, the conductive paste is selected from the list: silver paste, gold paste, copper paste, aluminum paste, iron paste, metal alloy paste, conductive polymer, or the likes. Conductive pastes that have been successfully used share commonality in having a high percentage of suspended silver powder particles, presumable well above the conductive percolation threshold, and having relatively non-volatile low-viscosity carrier resins; so that the silk screening of the paste into the desired locations is facile and measurably correct.

Figure 5:
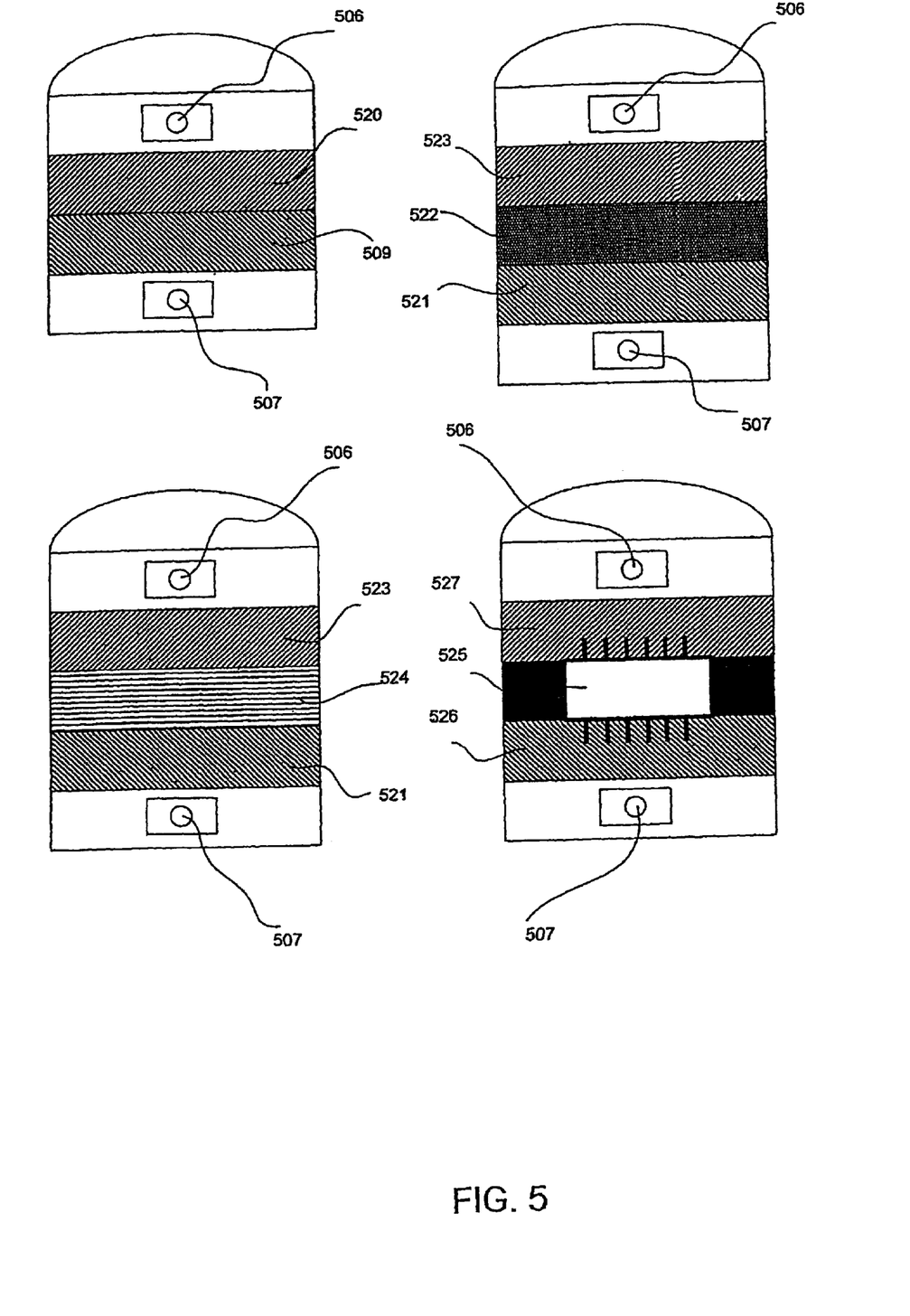
FIG. 5 shows a number of schematic views of vertical cross-sections of inter pad fat conductor constructions including various inter-pad materials which may be included as a layer in the paste.

According to another embodiment of the present invention, the conductive paste 509 has at least one interstitial layer of predetermined electrically active material 520. In the context of the present invention, "interstitial" relates to a macroscopic region located within the paste, and the region is substantially parallel to each of the plates in the final sandwiched construction; at least substantially within according to the cost effective fabrication tolerances customary to the art. According to the preferred variation of the current embodiment of the present invention, each layer of the at least one interstitial layers of the electrically active material is selected from the list: a predetermined electrical resistor, a predetermined electrical capacitor, a predetermined electrical inductor, a predetermined electrical transistor, or a predetermined electrical circuit having at least one conductive face.

Accordingly, one may consider the paste, per se, to be a multi component system (as may be appreciated in conjunction with FIG. 5) comprising of two like or disparate pastes 509 520. More typically, one may consider the paste as a three ply electrical "cross over" having simple external conductive material for the pad facing plies 521 523 and having an internal ply 522 selected because of its having one of the aforesaid "electrically active material" properties. Generally, in order to achieve the desired property, the thickness and volume of the active material must be considered to high fabrication precision. For this reason, consideration should be given to a prepackage 524 of this internal ply as an independent electrical component for insertion above a pad and a paste ply and below the other paste ply.

Alternatively stated, another embodiment of the present invention relates to the conductive paste including a pad-sized layered transistor 525 component arranged therein and the component is located in the central region of the paste 526 527, such that there is a portion of paste on either side of the component; in order for the resultant electrically conductive connection to include the material of the component therein. The pad size layered transistor component may include therein any gate type logic consistent with frequencies, voltages, etc. in the traversing (or gated) electrical field between the plate side pads.

Figure 6:
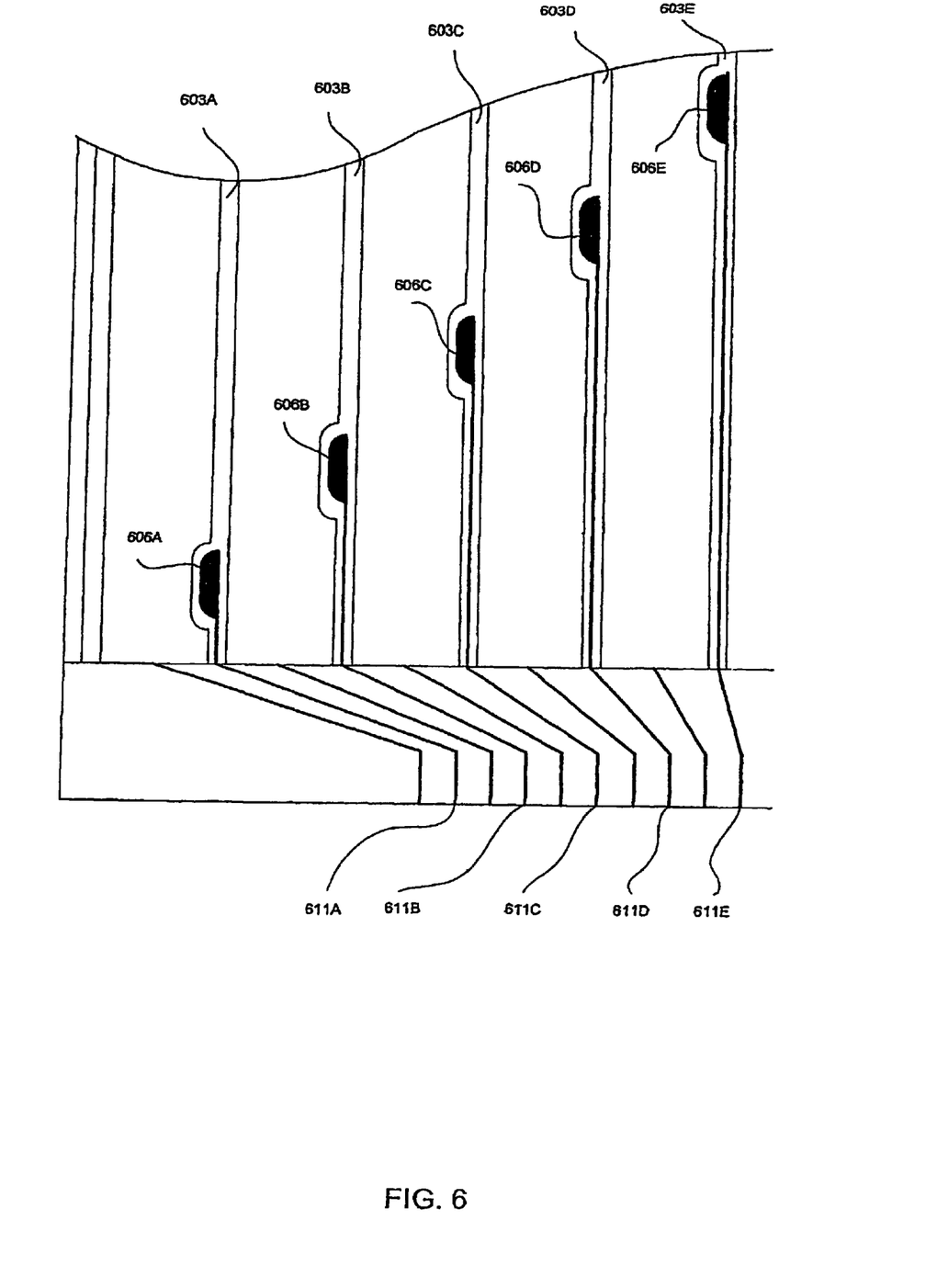
FIGS. 6 and 7 shows a detailed schematic view of a pair of plates (similar to those portrayed in FIG. 4) including a prearranged plurality of fat conductors.
Figure 7:
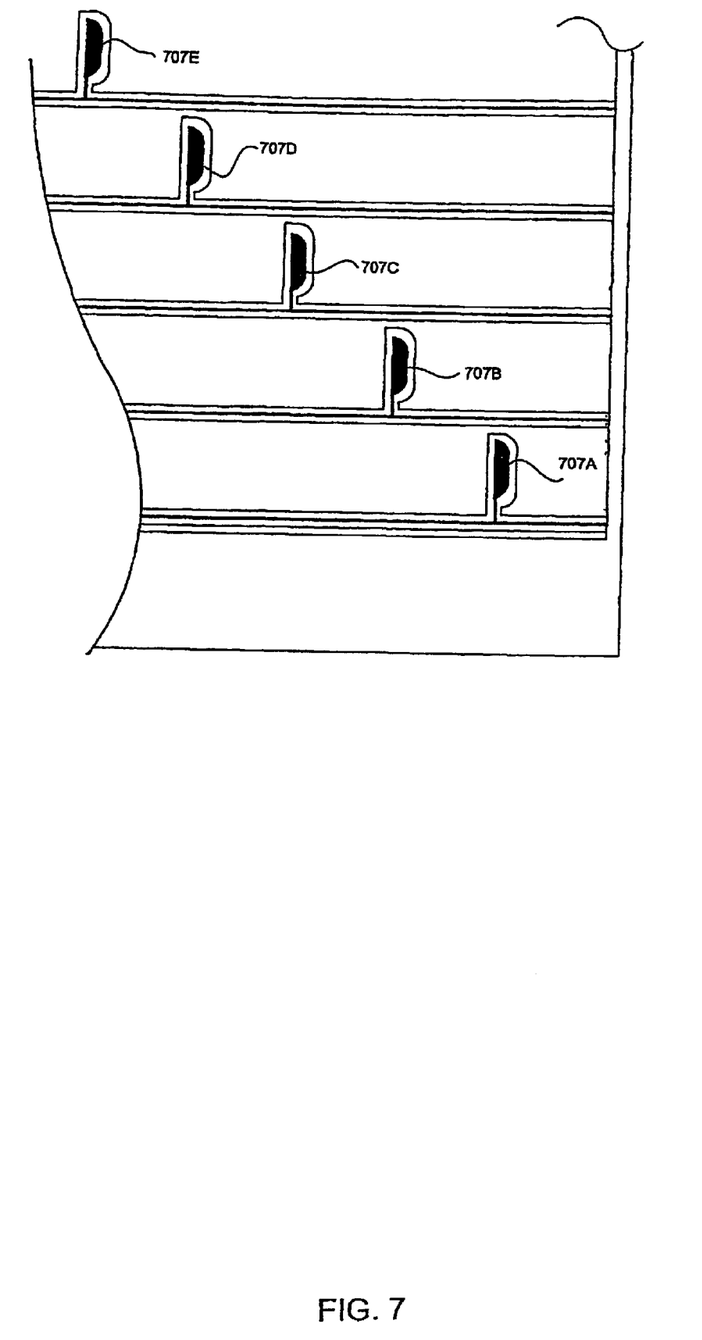

Embodiments and aspects of the invention may be embodied in various forms. Turning to FIGS. 6–7, the preferred presently best enabled form is substantially compliant with the following specification for fabrication of LCD wherein a module fabrication process is divided into two main tracks: (firstly) Pre back-end processes such as glass coating, ITO exposure to the layout and making the tracking; and (secondly) Back-end processes such as filling the LC into the glass, curing the glass, stacking the three glass double layers, connecting the FFC flexible connectors to each glass layer pair, and testing the modules made from three aligned pairs of plates (comprising six plates in total—although the same module could be accomplished using four aligned plates having the same three active addressable LCD interstitial layers there-between).

Having adjusted the industrial process fabrication ("fab") parameters to those measurable in laboratory, the following are the process recommendation:

Glass Procurement: Glass coating with ITO; Type: MERC Display Technologies Soda Lime sheet glass; Thickness: 0.7 mm;. Sheet resistance: specified=<15 Ohm typical 12 Ohm; Transmittance (at lambda=550 nm):>80%.

Cleaning: Clean the glass using Ultrasonic or solvent glass cleaning.

Expose to the ITO layout: Use photo exposure equipment to expose the layout for the ITO tracking. There are two different sides to expose: the "common" glass and the "active lines" glass (including therewith the "pads").

Masking the "fat-conductor" Connectors (hereinafter "Z-shorts" as a simplified nomenclature for z-axis short circuit electrical connections): It is recommended to use a mask for Nissan Corporation polyamide coating material (referred to as "PI-PO" in LCD FABs), to avoid coating at the Z-shorts connectors.

LCD rubbing process: The width of the layer is 300A–400A using the Japanese PI-PO for vertical alignment. The treatment must be on both sides of the interior glass module. (upper and lower).

Coating the silver "Z-short" connectors: Using a mask the silver paste for connection will be applied, the width of the layer will be 0.4 mm after process. The silver paste will be attached to a single glass.

Spacer Spray: Using a spacer deposition box spray: Space of 6.0 micron for the red layer; space of 4.5 micron for the blue layer; space of 4.5 micron for the green layer; (since this example relates to three pairs of plates: a first pair for including therein a blue-type LC dielectric film, a second pair for including therein a green-type LC dielectric film, and a third pair for including therein a red-type LC dielectric film.)

Glass Seal: Use a UV curing system to close all the boundary of the glass, leaving the feeling nozzles open. For use with "Loctite 3494" UV Cure optical glue as the adhesive perimeter wall. Loctite, of 1001 Trout Brook Crossing—Rocky Hill Conn./USA markets a product numbered 3094 which is "a single component, medium viscosity, fast UV/Visible curing adhesive specifically designed for bonding glass to itself and to a variety of other surfaces" (Industrial Version—June 2000 Technical Data Sheet).

Filling LC: The filling LC process can be in a vacuum chamber while the vacuum pump is connected during the entire filling process. It is possible to initiate the process in the chamber and then tack the glass out of the chamber while LC continue to fill the glass automatically in the capillary way. The temperature recommended to heat the mixture is 30–40 degrees Celsius.

Press Cycle: Using the press equipment press the layer to avoid un-unformity of the layer width. This process is for better optical performance.

FFC ("flat flexible connector") Connector: Mount the FFC connector to each layer using heat press or other method as needed.

Testing: The FFC connection is the most delicate element and based on our experiments is the bottleneck for the total yield performance. After connecting the FFC one must check the connectivity for each line. A testing protocol for this process should be supplied in keeping with normal operational research requirements, be they MIL-SPEC or otherwise. Nevertheless, in LCD applications, one prefers that all pixel-regions are individually addressable; even if the variance for controlling the optical properties at those regions shows un-wanted broad statistical variations.

Three Layer Connection (Stacking): Using UV curing glue, coat a 50A–70A width layer. This process is very sensitive and to eliminate bubbles use silk print method. Using a mechanical fixture to combine two layers, make sure that there is no gap in the vertical or horizontal direction using a magnifier glass or equivalent optical inspection.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

We claim:

1. A fat conductor electrically interconnecting between a pair of substantially parallel plates wherein each of the plates has a prearranged pattern of conducting surface coating regions on the interior face side thereof, and the fat conductor is specifically for use in sandwiched constructions of the plates having encapsulated dielectric film therebetween, the fat conductor including:
   a. two thin conductive surface coating pads of substantially complementary size and one of the two pads is located on each facing plate and the pads are situated to face each other when the plates are sandwiched together and each pad has an associated conductive surface coating path on its respective surface;
   b. a perimeter wall of adhesive arranged around one of the pads; and
   c. a conductive paste situated within the perimeter wall such that when the plates are sandwiched together there is formed an electrically conductive connection between the pads via the paste.

2. The fat conductor according to claim 1 wherein the conductive paste includes a pad-sized layered transistor component arranged therein and the component is located in the central region of the paste such that there is a portion of paste on either side of the component in order for the resultant electrically conductive connection to include the material of the component therein.

3. The fat conductor according to claim 1 wherein the associated connective surface coating path includes a conductive layer proximate to the plate and an insulating layer covering at least one predetermined area of the conductive layer.

4. The fat conductor according to claim 3 wherein the insulating layer is approximately 300–500 angstroms thick.

5. The fat conductor according to claim 1 wherein the pads are approximately 300–500 angstroms thick.

6. The fat conductor according to claim 1 wherein the associated connective surface coating path is approximately 300–500 angstroms thick.

7. The fat conductor according to claim 1 wherein the perimeter wall is approximately 4–7 microns thick.

8. The fat conductor according to claim 1 wherein the associated connective surface coating path of one of the pads extends to a connector region located proximate to an outer edge of the plate.

9. The fat conductor according to claim 8 wherein the connector region is arranged to be contiguously proximate to a preponderance of like connector regions and collectively all connector regions of the plate are located on a single edge of a single plate of the pair of plates.

10. The fat conductor according to claim 1 wherein the adhesive is an electrical insulator.

11. The fat conductor according to claim 1 wherein at least one of the plates is transparent and the adhesive is substantially optically transparent.

12. The fat conductor according to claim 11 wherein the adhesive is substantially inert with respect to a dielectric material that is a liquid crystal.

13. The fat conductor according to claim 12 wherein the liquid crystal is selected from the list: thermotropic; lyotropic; isotropic; nematic; twisted nematic; super twisted nematic; smectic; chiral nematic; cholesteric; cholesteric nematic; ferroelectric; surface-stabilized ferroelectric; ferroelectric chiral smectic; polymer dispersed.

14. The fat conductor according to claim 1 wherein the conductive paste is selected from the list: silver paste, gold paste, copper paste, aluminum paste, iron paste, metal alloy paste, conductive polymer.

15. The fat conductor according to claim 1 wherein the conductive paste has at least one interstitial layer of predetermined electrically active material.

16. The fat conductor according to claim 15 wherein each layer of the at least one interstitial layers of the electrically active material is selected from the list: a predetermined electrical resistor, a predetermined electrical capacitor, a predetermined electrical inductor, a predetermined electrical transistor, or a predetermined electrical circuit having at least one conductive face.

* * * * *